United States Patent [19]
Woods et al.

[11] Patent Number: 5,892,357
[45] Date of Patent: Apr. 6, 1999

[54] ELECTRO-OPTIC VOLTAGE SENSOR FOR SENSING VOLTAGE IN AN E-FIELD

[75] Inventors: Gregory K. Woods; Todd W. Renak, both of Idaho Falls, Id.

[73] Assignee: Lockheed Martin Idaho Technologies Company, Idaho Falls, Id.

[21] Appl. No.: 569,338

[22] Filed: Dec. 8, 1995

[51] Int. Cl.⁶ .................................................. G01R 31/00
[52] U.S. Cl. ............................ 324/96; 324/750; 324/753
[58] Field of Search ........................ 324/96, 750, 117 R, 324/126, 127, 244.1, 753, 752, 751, 501; 250/227.23, 310, 311; 356/368, 370, 400

[56] References Cited

U.S. PATENT DOCUMENTS

| | | | |
|---|---|---|---|
| 3,466,541 | 9/1969 | Bernard et al. .............................. | 324/96 |
| 4,147,979 | 4/1979 | Baues et al. ................................ | 324/96 |
| 4,412,173 | 10/1983 | Massey ....................................... | 324/96 |
| 4,510,441 | 4/1985 | Yasuda et al. .............................. | 324/96 |
| 4,564,754 | 1/1986 | Sato et al. .................................. | 324/96 |
| 4,719,415 | 1/1988 | Mehnert ..................................... | 324/96 |
| 4,812,025 | 3/1989 | Miller ......................................... | 350/435 |
| 5,034,679 | 7/1991 | Henderson et al. ........................ | 324/96 |
| 5,083,221 | 1/1992 | Toyoda et al. ............................. | 359/245 |
| 5,095,514 | 3/1992 | Curtis ......................................... | 385/12 |
| 5,113,131 | 5/1992 | Cooper et al. ............................. | 324/96 |
| 5,128,608 | 7/1992 | Ochi ........................................... | 324/96 |
| 5,280,173 | 1/1994 | Morse et al. ............................... | 250/227.23 |
| 5,396,166 | 3/1995 | Vohra et al. ............................... | 324/96 |
| 5,486,754 | 1/1996 | Cruden et al. ............................. | 324/96 |

FOREIGN PATENT DOCUMENTS

| | | | |
|---|---|---|---|
| 60-256068 | 12/1985 | Japan .......................................... | 4/46.1 |

*Primary Examiner*—Vinh P. Nguyen
*Attorney, Agent, or Firm*—Thorpe North & Western

[57] ABSTRACT

A miniature electro-optic voltage sensor system capable of accurate operation at high voltages. The system employs a transmitter, a sensor disposed adjacent to but out of direct electrical contact with a conductor on which the voltage is to be measured, a detector, and a signal processor. The transmitter produces a beam of electromagnetic radiation which is routed into the sensor where the beam undergoes the Pockels electro-optic effect. The electro-optic effect causes phase shifting in the beam, which is in turn converted to a pair of independent beams, from which the voltage of a system based on its E-field is determined when the two beams are normalized by the signal processor. The sensor converts the beam by splitting the beam in accordance with the axes of the beam's polarization state (an ellipse whose ellipticity varies between −1 and +1 in proportion to voltage) into at least two AM signals. These AM signals are fed into a signal processor and processed to determine the voltage between a ground conductor and the conductor on which voltage is being measured.

18 Claims, 8 Drawing Sheets

ELECTRO-OPTIC VOLTAGE SENSOR FOR SENSING VOLTAGE IN AN E-FIELD

CONTRACTUAL ORIGIN OF THE INVENTION

The United States has rights in this invention pursuant to contract number DE-AC07-94ID13223 between the U.S. Department of Energy and Lockheed Idaho Technologies Company.

BACKGROUND OF THE INVENTION

1. Field of the Invention

The present invention pertains generally to the field of voltage sensors and more particularly to a voltage sensor system which utilizes the Pockels electro-optic effect to measure voltage.

2. Background Art

High-accuracy measurement of high voltage has traditionally been accomplished using iron-core ferro-magnetic potential transformers. These devices have substantially limited dynamic range, bandwidth, linearity, and electrical isolation. During electrical fault conditions these transformers can conduct dangerous levels of fault energy to downstream instrumentation and personnel, posing an additional liability.

A variety of optic sensors for measuring voltage have been developed in attempts to offer the power industry an alternative to the conventional transformer technology. Generally, these voltage sensor systems require that direct electrical contact be made with the energized conductor. This contact is made necessary by the use of a voltage divider which is utilized to connect the sensing element with the energized conductor on which a measurement is to be made. Direct electrical contact with the conductor may alter or interrupt the operation of the power system by presenting a burden or load.

In addition to the disadvantages associated with direct electrical contact with the energized conductor, prior art voltage sensor systems are typically bulky, particularly in extremely high voltage applications. This is true because the size of the voltage divider required is proportional to the voltage being measured. The size of such systems can make them difficult and expensive to install and house in substations.

Many prior art sensors are based upon the electrostrictive principle which utilize interferometric modulation principles. Unfortunately, interferometric modulation is extremely temperature sensitive. This temperature sensitivity requires controlled conditions in order to obtain accurate voltage measurements. The requirement of controlled conditions limits the usefulness of such systems and makes them unsuited for outdoor or uncontrolled applications. In addition, interferometric modulation requires a highly coherent source of electromagnetic radiation, which is relatively expensive.

Open-air E-field based sensors have also been developed, but lack accuracy when used for measuring voltage because the open-air E-field used varies with many noisy parameters including ambient dielectric constant, adjacent conductor voltages, moving conductive structures such as passing vehicles, and other electromagnetic noise contributions.

Systems which utilize mechanical modulation of the optical reflection within an optic fiber have also been developed. Among other drawbacks, the reliance of such systems on moving parts is a significant deterrent to widespread use.

It would therefore be an advantage in the art to provide a system which does not require direct electrical contact with the energized conductor, is compact, operates in a variety of temperatures and conditions, is reliable, and is cost effective.

SUMMARY OF THE INVENTION

It is therefore an object of the present invention to provide an a electro-optic voltage sensor system which does not require contact with a conductor.

It is a further object of the present invention to provide such an electro-optic voltage sensor system which is capable of use in a variety of environ mental conditions.

It is a still further object of the present invention to provide such an electro-optic voltage sensor system which can be employed to accurately measure high voltages without use of dedicated voltage division hardware.

It is an additional object of the present invention to provide such an electro-optic voltage sensor system which minimizes the electronics needed for implementation.

It is a further object of the present invention to provide a sensor system capable of being integrated with existing types of high voltage power transmission and distribution equipment so as to reduce or eliminate the need for largest and-alone voltage measurement apparatus.

It is yet another object of the present invention to provide a sensor system capable of being integrated with existing types of power transmission and distribution equipment.

These and other objects of the present invention will become more fully apparent from the following description and appended claims or may be learned by the practice of the invention as set forth herein.

While the present invention is described in terms of a sensor system, it is to be understood that the subject apparatus and method may be used in any field of electrical or optical application. Those having ordinary skill in the field of this invention will appreciate the advantages of the invention, and its application to a wide variety of electrical uses.

The above objects and others not specifically recited are realized in a specific illustrative embodiment of an Electro-Optical Voltage Sensor System whereby one may measure the voltage difference (or electrical potential difference) between objects or positions. Voltage is a function of the electric field (hereinafter "electric field" shall be indicated "E-field") and the geometries, compositions and distances of the conductive and insulating matter. Where, as in the present invention, the effects of an E-field can be observed, a voltage measurement can be calculated.

The invention employs a transmitter, a sensor, a detector, and a signal processor. The transmitter produces a beam of electromagnetic radiation which is routed into the sensor. Although this electromagnetic radiation used in the present invention can comprise any wavelengths beyond the visible spectrum, the term "light" will be used hereinafter to denote electromagnetic radiation for the purpose of brevity. The beam undergoes polarization before it undergoes an electro-optic effect in the transducing material of the sensor. In the polarized beam the light has at least two components which propagate along at least two orthogonal axes, thus forming at least two orthogonal planes within the beam. The electro-optic effect occurs when the sensor is placed into an E-field, and is observable as a phase differential shift of the orthogonal beam components. The planes of propagation are the object of the differential phase shift. The differential phase shift causes a corresponding change in the beam's polarization. The polarization change is in turn converted into a set of amplitude modulated (AM) signals of opposing polarity that are transmitted out of the sensor. The detector converts the set of optical AM signals into electrical signals from which the voltage is determined by the signal processor.

The sensor processes the beam by splitting the beam in accordance with the components of the orthogonal polarization planes into at least two AM signals. In the preferred embodiment, these AM signals are then converted into digital signals, fed into a digital signal processor and mathematically processed into a signal proportional to the voltage which produced the E-field.

BRIEF DESCRIPTION OF THE DRAWINGS

The above and other objects, features and ad vantages of the invention will become apparent from a consideration of the subsequent detailed description presented in connection with the accompanying drawings in which.

DETAILED DESCRIPTION

Figure 1:
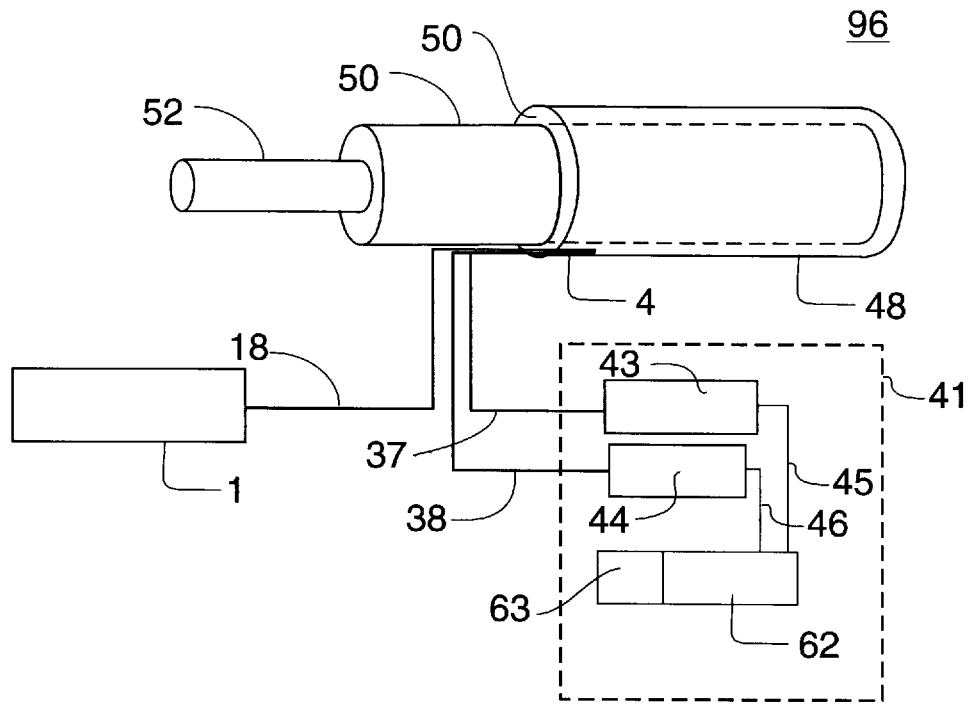
FIG. 1 is a diagram of the electro-optical voltage sensor system shown in a generalized high voltage application scenario. The diagram was made in accordance with the principles of the present invention.

A preferred embodiment in accordance with the present invention is illustrated in FIG. 1, which is a diagram of the electro-optical voltage sensor system. There is shown a transmitter 1 that transmits a beam of electromagnetic radiation (the beam is not shown in FIG. 1 but generally designated as 12 elsewhere) and a sensor head 4. In the preferred embodiment the beam is routed from the transmitter 1 to the sensor head 4 by a polarization maintaining (PM) fiber 18. In an alternative embodiment the PM fiber 18 is replaced by low-birefringence fiber. Another alternative embodiment whose cost/performance characteristic may be quite different and better suited to certain applications, entails replacement of the PM fiber 18 by single-mode or multi-mode optic fiber. The PM fiber 18 directs the beam from the transmitter 1 into the sensor head 4. Optical signals are routed from the sensor head 4 by a pair of either single-mode or multi-mode optical fibers, shown as 37 and 38. The optical fibers 18, 37, and 38 electrically isolate the sensor head 4 from the transmitter 1 and the rest of the detection system, providing further protection to personnel and equipment from the dangers of high voltage systems.

Figure 8:
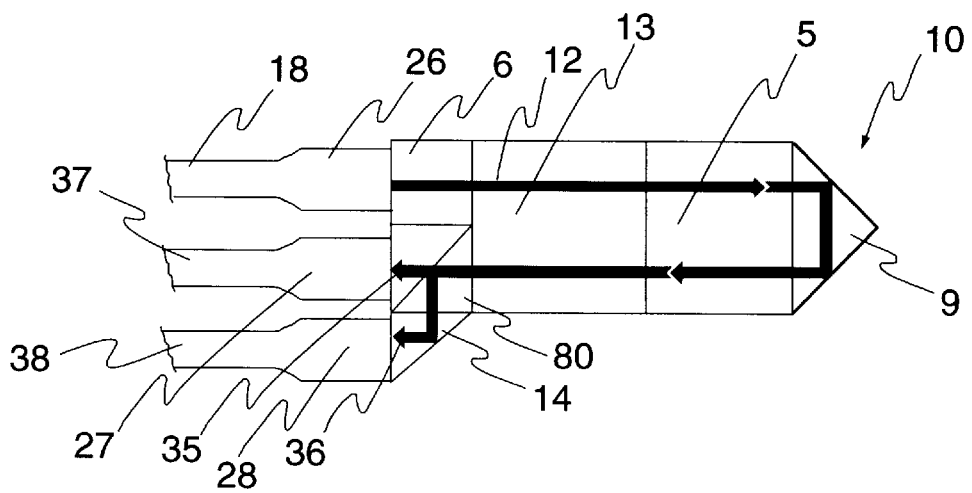
FIG. 8 is a top-down schematic view of one embodiment of the sensor head of FIG. 1.

The sensor head of the preferred embodiment of FIG. 1 is shown in greater detail in the top-down schematic view of FIG. 8, where the preferred embodiment of the sensor head is generally depicted at 4. The sensor head 4 comprises a polarizer 6, a translucent medium 13, a transducer 5, a retro-reflector generally depicted at 10, a polarizing beam splitter 80 and beam reflector 14. A collimator 26 is connected to the PM fiber 18 and transmits the beam 12 from the PM fiber 18 into the polarizer 6. The polarizer 6 polarizes the beam 12 when the beam 12 is transmitted from the collimator 26; thus, the polarizer 6 polarizes the beam 12 if the beam 12 is not polarized when it is transmitted from the collimator 26, or re-polarizes the beam 12 if the beam 12 is polarized when it is transmitted from the collimator 26. As a practical matter, the polarizer 6 could be eliminated or placed anywhere between the transducer 5 and the transmitter of the beam 12, including anywhere along the PM fiber 18. In an alternative embodiment the PM fiber 18 can be aligned with sufficient precision with respect to the optical axes of the transducing medium, to perform the function of (and eliminate the need for) the polarizer 6. The beam 12 passes from the polarizer 6 through the translucent medium 13 and into the transducer 5. The translucent medium 13 comprises a non-conductive, non-birefringent material, such as fused quartz or a similar substance, which provides a pathway for the beam from the polarizer 6, which is preferably situated outside the E-field, to the transducer 5, which must reside within the E-field. The source of this E-field will be discussed shortly.

When the transducer 5 (also called the transducing medium) is in a non-zero E-field (not shown) it induces a "differential phase shift" to orthogonal beam components of the beam 12 through the Pockels electro-optic effect, which will now be explained. In the polarized beam 12 the light has at least two components which propagate along at least two orthogonal planes, respectively, thus forming at least two orthogonal planes within the beam 12. The phase of the components in each plane of propagation are the object of a shift, relative to the phase of the component in the other plane, in the transducer 5. The Pockels electro-optic effect, which takes place in transducer 5, changes the relative phases of the beam components by altering their respective velocities, and is observed in Pockels transducing crystals and similar media. The magnitude of the phase shift, called the "differential phase shift", is proportional to the magnitude of the E-field. Thus, the Pockels electro-optic effect is observed as a "phase differential shift" of the orthogonal beam components which is proportional to the magnitude of the E-field. Due to the fixed coaxial structure of the devices in which the sensor head is to be installed, the magnitude of the E-field is proportional to the voltage. Therefore, the differential phase shift is proportional to (and can be used to measure) the voltage of the E-field between energized conductor and ground conductor.

The phase shift between orthogonal components further manifests itself as an alteration of the beam's polarization. Therefore, the beam may be considered either to be a differential phase shifted signal or an optical polarization modulation signal. The polarization modulation signal is used in the present invention because it can be detected using low-cost, components that are less susceptible to temperature, mechanical perturbations, and optical incoherence than those component s that would be required to sense the differential phase shift directly.

Figure 7A:
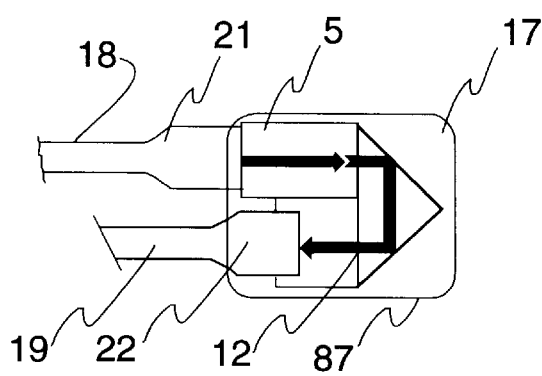
FIG. 7a is a top-down schematic view of one embodiment of the sensor head of FIG. 2.
Figure 7B:
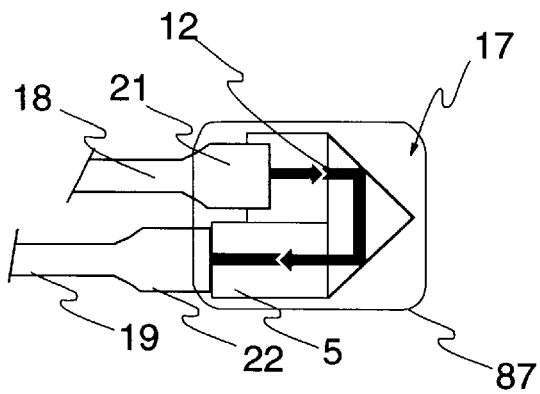
FIG. 7b is a top-down schematic view of one embodiment of the sensor head of FIG. 2.
Figure 7C:
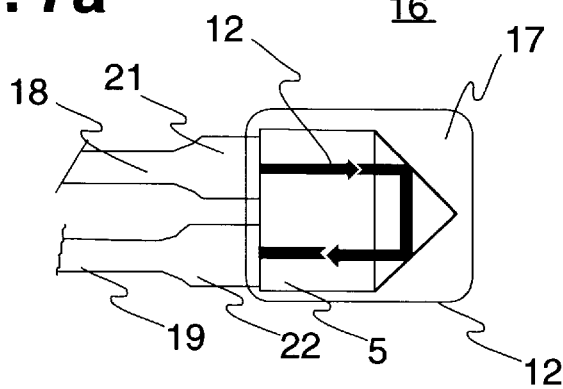
FIG. 7c is a top-down schematic view of one embodiment of the sensor head of FIG. 2.

In the practice of the present invention, the sensor head 4 or the transducer 5 may be encased in a dielectric buffering material, generally depicted at 87 in FIGS. 7a, 7b, and 7c, to smooth the transition geometry between the permittivity of the transducer 5 and the permittivity of the surrounding media, which in most cases will be an insulator. The dielectric buffering material promotes uniformity in the E-field, particularly around the edges of the transducer 5. This enhances uniform phase shift in the beam 12 passing through the transducer 5, and minimizes voltage stress on the materials in and surrounding the sensor head 4 as well, thereby increasing the probable maximum operating lifetime of the entire system.

After the beam 12 has passed sequentially through the polarizer 6 (FIG. 8), translucent medium 13 and transducer 5, it enters into the retro-reflector 10. The retro-reflector 10 comprises a reflector material 9 which induces the beam to reflect and causes a quarter-wave retarding of the beam 12. The quarter-wave retarding property of the reflector material 9 induces a ¼ wavelength shift in the orthogonal planes of the beam 12. The ¼ wavelength shift can be achieved by reflection of the beam 12 alone, if the material 9 is non-birefringent; alternatively, the material 9 can comprise birefringent reflector material wherein the properties of the material help achieve the shift.

If a reflector material 9 having birefringence is used, the phase shifting occurs when orthogonal components of the electromagnetic waves of the beam are shifted (here by ¼ a wave length) with respect to one another. This birefringence, which is inherent in some materials, is not dependent upon the E-field. In the preferred embodiment, a reflector material 9 is used which exhibits a reflection-induced retardation to differentially shift the relative phases of the beam components in orthogonal planes in the beam 12 by $\pi/2$ radians. The polarization of the beam 12 incident upon the retro-reflector 10 depends upon the E-field present when the beam 12 makes a first pass through the transducer 5. If there is an E-field present then there will be some differential phase shift already present in the beam 12.

The $\pi/2$ retardation within the retro-reflector 10 biases the sensor's overall resultant polarization such that zero E-field (and hence zero voltage) corresponds to circular-polarized light, as no differential phase shift is induced upon the beam 12 by the transducer 5. However, due to the location of the retro-reflector 10 in the sensor head 4, if the transducer 5 is in a non-zero E-field and induces a differential phase shift in the beam 12, then the retro-reflector 10 will not convert light from linear to circular-polarization, rather it will induce elliptical-polarization upon the beam 12, whose ellipticity will vary in proportion to the voltage. While laser light is used in the preferred embodiment, other forms of electromagnetic radiation could also be used in the practice of the invention.

The reflection of the beam 12 in the retro-reflector 10 is in accordance with the principle of the angle of incidence being the same as the angle of reflection. In the practice of the preferred embodiment of the present invention, the retro-reflector 10 is configured to cause a 180° change in the direction of the beam 12, thereby sending the beam back into the transducer 5. Upon each reflection, a beam 12 may be induced to undergo a ⅛ wave length phase shift to produce a total of ¼ wave phase shift, as in the preferred embodiment. One skilled in the art could further induce a ¼ wave length shift in beam 12 by combining reflection and birefringence.

When the beam 12 reenters the transducer 5, it undergoes further phase shift from the Pockels electro-optic effect. As shown in FIG. 8, the beam 12 then passes through the translucent medium 13 and enters into the polarizing beam splitter 80.

Figure 3:
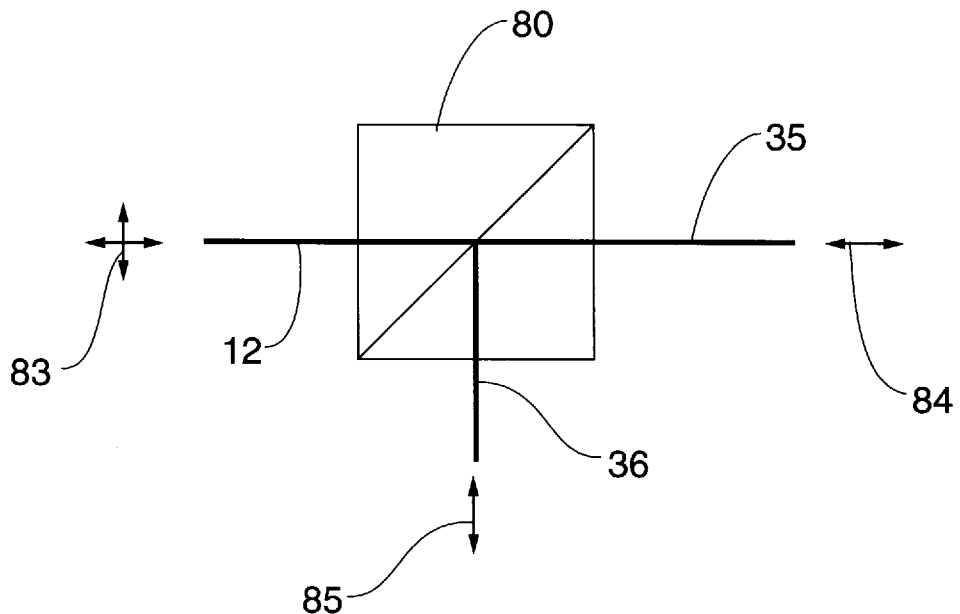
FIG. 3 is a diagram of the light polarizing beam splitter of FIGS. 1 and 2.

In the polarizing beam splitter 80, (also called an analyzer in the art), the beam 12 is separated in accordance with the respective axes of its polarization ellipse into AM signals 35 and 36. The said polarization ellipse will exhibit an ellipticity ranging between −1 and +1, in proportion to voltage at any given time. Those skilled in the art will note that an elliptic polarization whose ellipticity ranges between −1 and +1 can be described as ranging from a linear polarization along one axis to a linear polarization along a second axis perpendicular to the first axis, wherein the point at which ellipticity equals 0 corresponds to circular polarization. As shown in FIG. 3, the major and minor axes of the polarization ellipse of beam 12 can be represented by two orthogonal components, indicated generally at 83. The beam splitter 80 then separates the beam 12 into two components 84 and 85 which comprise the intensities along each of the two axes of the polarization ellipse shown as orthogonal components 83. The intensity of beam components 84 and 85 will modulate conversely to one another in response to modulations in the ellipticity of the beam's polarization. The beam components 84 and 85 are two AM signals shown as 35 and 36, respectively, which are routed as shown in FIG. 1 into photo-detectors 43 and 44, respectively.

The AM signals 35 and 36 are then passed by collimators 27 and 28, shown in FIG. 8, and routed through multi-mode or single-mode optic fibers 37, 38. A beam reflector 14 may be used to aid in routing the AM signals 35 and 36.

As shown in FIG. 1, first and second translucent fibers 37 and 38, are used to route the AM signals 35 and 36 from the sensing means into the detector 41. First the AM signals 35 and 36 are routed into the photodetectors 43 and 44 through the first and second translucent fibers 37 and 38, respectively. In the preferred embodiment the first and second translucent fibers 37 and 38 comprise at least one optic fiber, wherein the optic fiber is selected from the group consisting of: a single-mode optic fiber, and a multi-mode optic fiber. In the photodetectors 43 and 44 the AM signals 35 and 36 become electrical signals 45 and 46. The electrical signals 45 and 46 are routed into a signal processor 62, the final component of the detector 41, wherein a desired E-field characteristic is determined, particularly that of voltage.

To determine the voltage in the practice of the preferred embodiment of the present invention the signal processor 62 is designed to sample each AM signal at substantially regular intervals and substantially simultaneous times, process the signals to produce a display signal (not shown) which is then displayed on a readable display 63 such as: digital, hardcopy, video, software, computer memory displays or an audible indicator.

While it is possible to actually measure the relative phases of the orthogonal components of the beam 12 after exiting the transducer, the relative phase shift can also be derived from the intensities of the AM signals 35 and 36 shown in FIG. 8 without using complex and costly approaches as involved in direct phase measurements. Therefore, in the present invention, when the two AM signals 35 and 36 are separated from a single differential phase shifted signal using a properly oriented polarizing beam splitter 80, the beam's polarization state is analyzed to obtain AM intensity signals. The AM signals 35 and 36 extracted from the beam's polarization state by the splitter 80 are transmitted to and used in the signal processor 62 where their complementary nature facilitates rejection of common mode noise and minimizes effects of temperature dependent intrinsic birefringence that may reside in the transducing medium or other optical components within the system. This feature of the present invention substantially enhances accuracy and practicality of the system and represents an additional advancement over much of the prior art. The signal processor 62 performs these functions while converting the received AM signals 35 and 36 into a single, highly accurate voltage measurement. In addition to measuring the voltage of a device, the invention may be used in conjunction with a device for measuring current to provide information regarding power, power factor angle, and energy on the conductor of interest.

As mentioned, each AM signal, 35 and 36 (FIG. 8) is converted by a photo-detector 43 and 44 (FIG. 1) into a electrical signal 45 and 46 (FIG. 1) which can be processed by the signal processor 62. The photodetector comprises an optic-to-electronic conversion means for converting said AM signals into analog electronic signals. Preferably, the analog electronic signals comprise low-level analog voltage signals or current signals.

In the preferred embodiment of the present invention the electrical signals 45 and 46 are electronic signals transmitted to the signal processor 62 which correspond to the intensity of the AM signals 35 and 36. Thus, in the practice of the present invention, a series of AM signals are manipulated by the signal processor 62, as each of the electrical signals 45 and 46 corresponds to intensity of each AM signal 35 and 36. The electrical signals 45 and 46 are sampled by the signal processor 62 at regular intervals and substantially simultaneously with one another. The sampled signals are the instantaneous intensity for each AM signal, 35 and 36. These intensity signals will be discussed below as (A) and (B), respectively.

In the signal processor 62 (FIG. 1) the instantaneous intensity signal for each beam component is sampled sequentially and stored, thereby forming a data base of stored signals which represents each AM signal over time. The stored signals are then converted into a displayable signal regarding the voltage of E-field at the transducer 5 (FIG. 8).

In the preferred embodiment signals are manipulated in the following manner. First, an average intensity for each independent amplitude modulated signal is calculated. This is done by summing the instantaneous intensities of the signals which have been sampled over a pre-determined time interval and dividing by the number of samples taken in the interval. In the preferred invention this is accomplished by taking the average of the signals over time for each beam component by summing the signals of each beam component and dividing the sum by the number of signal samples taken.

Mathematically, the average intensity for the AM signal (A) is expressed as follows:

$$\overline{A} = (1/L) \sum_{i=n-L}^{n} A_i$$

where the average intensity is (), the instantaneous AM signal is ($A_i$), the number of samples is (L), the samples are taken and stored at uniform time intervals (i), and the average is calculated using samples between present time index n and past time index (n-L). Similarly, the average intensity for the AM signal (B) is expressed as follows:

$$\overline{B} = (1/L) \sum_{i=n-L}^{n} B_i$$

where the average intensity is (), the instantaneous AM signal is ($B_i$), with the other values being as above.

Next, an adjusted instantaneous intensity for each signal is found by comparing the most recent instantaneous signal intensity with the average signal intensity of the corresponding AM signal. Thus, for the beam component corresponding to AM signal (A), the adjusted instantaneous intensity ($I_n$) is:

$$I_n = \overline{A} - A_n$$

Where at ($A_n$) is the instantaneous intensity of AM signal (A) at the present time index. Similarly, for AM signal (B), the adjusted instantaneous intensity ($J_n$) is:

$$J_n = \overline{B} - B_n$$

Where ($B_n$) is the instantaneous intensity of signal (B) at the present time. It will be recognized by those skilled in the art that because signals (A) and (B) each represents a different axis on the polarization ellipse, their amplitudes will change in opposite directions from one another for a given change in polarization. Thus where the intensity of one signal increases there will be a decrease of intensity of equal magnitude in the other signal. Therefore, the adjusted instantaneous intensity signals ($I_n$) and ($J_n$) must be computed as indicated above in order to preserve sign.

The adjusted average instantaneous intensity signal for both signals (A) and (B) compensates for any temperature induced birefringence that may exist within the transducer. Temperature induced birefringence causes a change in the intensity of the AM signals over time, as the transducer heat or cools. The variation in the intensity due to temperature-dependant intrinsic birefringence of the transducer appears as a modulation or variation in the average intensity. Thus, by comparing the instantaneous intensity with the average intensity of the signals, and deducting the average intensity from the instantaneous intensity, temperature induced variations of the signal due to the birefringence in the transducer are compensated for in the adjusted instantaneous intensity signals ($I_n$) and ($J_n$).

An additional manipulation of the adjusted instantaneous intensity signals ($I_n$) and ($J_n$) compensates for intensity fluctuations and other common mode noise. This is accomplished by comparing the average of the adjusted instantaneous intensity signals ($I_n$) and ($J_n$) for the signals (A) and (B). This comparison entails calculating the average between ($I_n$) and the sign-reversed value of ($J_n$).

$$K_n = \frac{(I_n - J_n)}{2}$$

This average ($K_n$) is directly proportional to the voltage. This is so because the Pockels electro-optic effect induces a differential phase shift in the orthogonal planes of the beam 12 (FIG. 8) which is directly proportional to the E-field, and the E-field is directly proportional to voltage. Thus, for a sampling of interest (n), the average instantaneous intensity signal ($K_n$) for the signals (A) and (B) is directly proportional to the actual instantaneous voltage ($V_n$) between energized conductor and ground, varying only by a scaling constant (K).

$$V_n = KK_n = K\frac{(I_n - J_n)}{2}$$

The scaling constant (K) is determined by applying a precisely known voltage to the device of interest and adjusting the scaling constant (K) until the value measured as the actual instantaneous voltage ($V_n$) is equivalent to the precisely known voltage being applied. In a typical general application of the present invention, shown in FIG. 1, the sensor head 4 is placed in an insulator 50 between a conductor 52 and a grounded conductor 48. When voltage is applied to the conductor 52 an E-field is created between the conductor 52 and the grounded conductor 48, in the insulator 50. Determination of the scaling constant (K) is accomplished by applying a precisely known voltage to the conductor 52. Once the scaling constant (K) is known the electro-optical voltage sensor system may be operated to determine additional actual instantaneous voltages applied to conductor 52.

Figure 2:
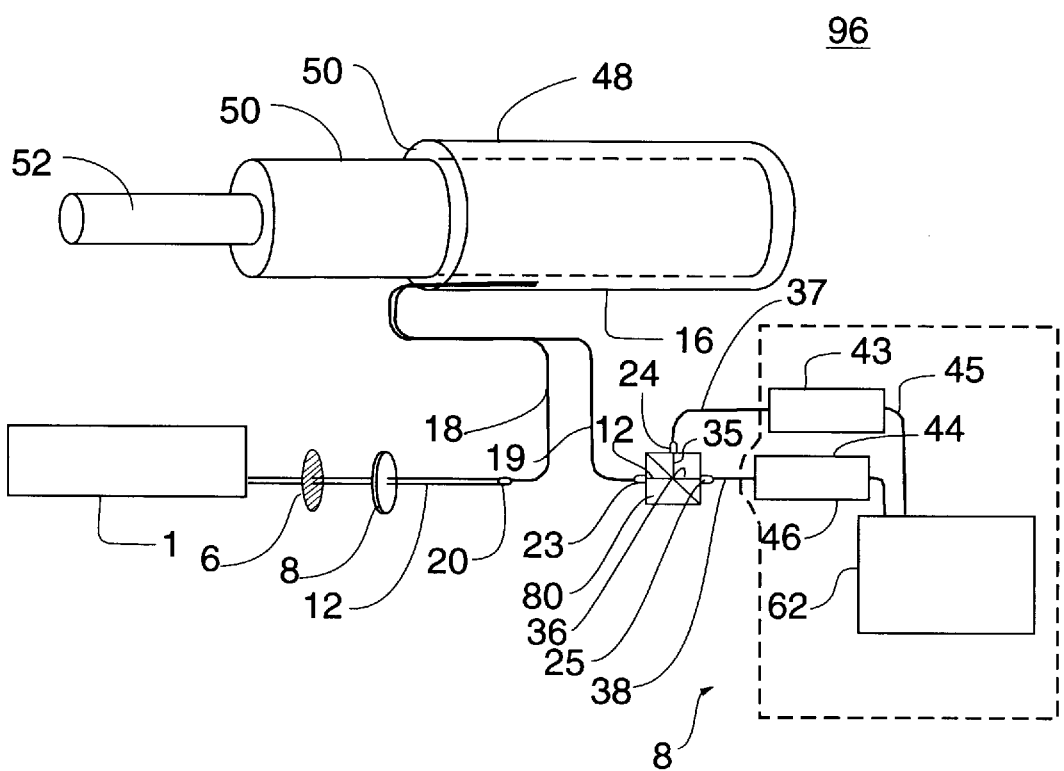
FIG. 2 is a diagram of an alternative embodiment of the electro-optical voltage sensor system (in the same generalized application scenario) made in accordance with the principles of the present invention.

An alternative embodiment in accordance with the present invention is illustrated in FIG. 2, which is a diagram of the electro-optical voltage sensor system. Wherever practicable, components in the alternative embodiment which are equivalent to those discussed above have the same reference numbers. In this embodiment there is shown a transmitter 1, which comprises a laser (not shown), a polarizer 6, and a wave plate 9. The laser emits an electromagnetic radiation beam 12. The electromagnetic radiation beam 12 passes first through a polarizer 6 and then a wave plate 9, producing a polarized beam 12 which may be circular-polarized. The beam 12 enters into a PM optic fiber 18 through a collimator 20. The PM optic fiber 18 may further comprise a low-birefringence optic fiber. The optic fiber 18 routes the beam 12 to a sensor head generally designated at 16. It is important to note that the sensor head 16 in this alternative embodiment shown in FIG. 2 differs from the sensor head 4 of the preferred embodiment shown in FIG. 1.

The detector generally depicted at 8, as shown in FIG. 2, comprises a polarizing beam splitter 80, at least two photo-detectors 43, 44, and a signal processor 62. The beam 12 is routed from the sensor head 16 through another PM optic fiber 19 through a collimator 23 and into the polarizing beam splitter 80. Again, as shown in FIG. 3, the polarizing beam splitter 80 separates the polarized beam 12 in accordance with the respective separate wave components propagating in the orthogonal axes of the polarization ellipse into AM signals 35, 36. In the embodiment shown in FIG. 2, the AM signals 35, 36 which are analog optic signals, are routed through multi-mode or single-mode optic fibers 37, 38 to the photodetectors 43, 44.

The photo-detectors convert the AM signals 35, 36 into electrical signals 45, 46 which can be analyzed in the signal processor 62.

Figure 4:
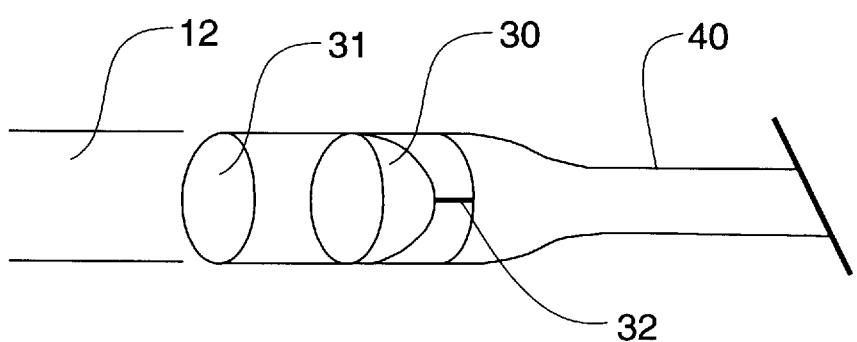
FIG. 4 shows a partially sectioned side view of a collimator of FIG. 2 and also FIGS. 7 and 8, below.

Prior to discussing the sensor head 16, consider the collimators 20, 21, 22, 23, 24, 25 in FIGS. 2, 7a, 7b, and 7c and collimators 26, 27 and 28 in FIG. 8, which each are generally represented by the collimator 29, shown in FIG. 4. Generally, a collimator 29 comprises a lens 30 and a transparent end 31 which can pass a beam 12 into or out of the core 32 of an optic fiber 40. A collimator used to couple light into the core of an optic fiber is sometimes also referred to as a "coupler" in the art, but the term "collimator" is used herein for simplicity. In the preferred embodiment, the optic fiber 40 is a PM optic fiber 18, which may also take the form of low-birefringence fiber.

Referring to FIGS. 7a, 7b, and 7c, these alternative embodiments of the sensor head 16 comprise a transducer 5 and a reflector 17. In FIG. 7a the beam 12 enters into the sensor head 16, through a collimator 21 which is attached to a PM fiber 18. The beam 12 then passes through the transducer 5 and upon being reflected by a beam reflector 17 the beams is channeled along a path substantially parallel to the that which is followed through the transducer and enters into a second collimator 22. The second collimator 22 is connected to an optical fiber 19 by which the beam 12 is routed away from the sensor head 16.

Similarly, in the practice of the alternative embodiment of FIG. 7b, the beam 12 enters into the sensor head 16, through a collimator 21 which is attached to a PM fiber 18, following which it is reflected by the beam reflector 17 into the transducer 5. The beam 12, after passing through the transducer 5 would enter into a second collimator 22 connected to an optical fiber 19 and be routed away from the sensor head 16.

Likewise, in the practice of the alternative embodiment of FIG. 7c, the beam 12 enters into the sensor head 16, following which it travels through the transducer 5. The beam 12 is then reflected by the beam reflector 17 back through the transducer 5, and into a second collimator 22 connected to an optical fiber 19. The beam 12 is then routed away from the sensor head 16.

In the embodiments of FIGS. 1 and 2, the sensor heads 4 and 16 each have a cross-sectional area of only approximately fifty millimeters squared (50 $mm^2$) or less, and a length of approximately twenty five centimeters (25 cm) or less, depending upon the particular apparatus in which the sensor head is embedded.

Figure 5:
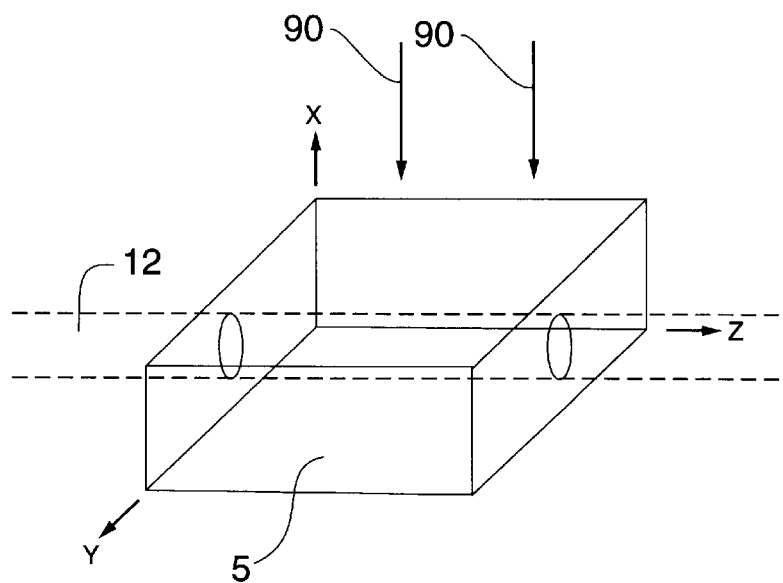
FIG. 5 is a diagram of one embodiment of the transducer of FIGS. 1 and 2, wherein transducing material in only one orientation is shown.

There are two alternative embodiments of the transducer 5 which vary according to intrinsic birefringence. The first embodiment of the transducer 5, as shown in FIG. 5, is particularly appropriate where the transducer material 5 does not exhibit intrinsic birefringence along the propagation axis, shown as z. The beam 12 propagates along axis z. The transducer 5 in the presence of the E-field 90 causes differential phase modulation in the orthogonal planes of the beam 12. The embodiment shown in FIG. 5 is preferred where the transducer 5 exhibits no intrinsic birefringence. It is desirable to avoid intrinsic birefringence, as it is typically temperature dependant.

Figure 6:
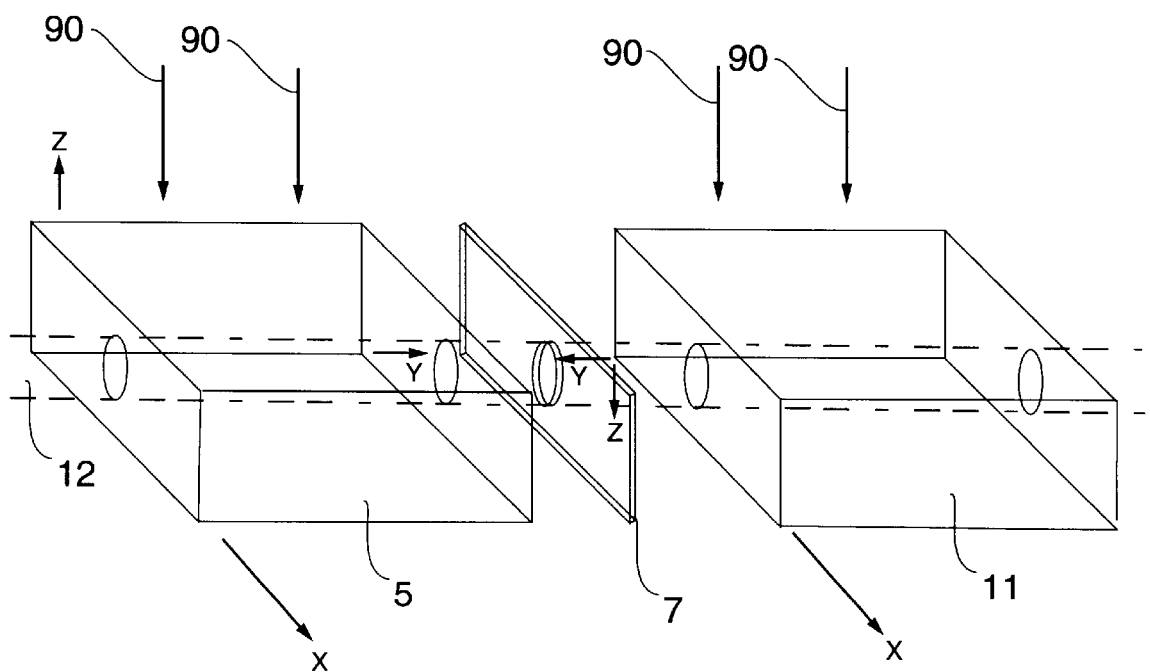
FIG. 6 is a diagram of one embodiment of the transducer in FIGS. 1 and 2, wherein transducing material in two orientations is shown.

The second embodiment for the transducer 5 which exhibits intrinsic birefringence is shown in FIG. 6. Here, the transducer (or transducing media) 5 and a second transducer (or second transducing media) 11, have matched intrinsic birefringence to one another along the optical propagation axes (or optical propagation orientation axes), shown as y'.

The transducer 5 is aligned with the second transducer 11 such that the optical propagation axes y' are rotated ninety degrees (180°) with respect to one another. The E-field 90, aligned along the z axes, achieves a reverse polarity in the second transducer 11. The orientation of the beam 12 with respect to the optical propagation orientation axes y' is preserved by the rotation of the beam 12 by ninety degrees (90°). This rotation of the orientation is achieved by placement of a 90° polarization rotator 7 between the first transducer 5 and the second transducer 11. This configuration achieves cancellation of the effects of intrinsic temperature dependant birefringence, while yielding a differential phase shift in each transducer 5, 11. Thus, in this embodiment, the beam 12 goes through the transducer 5 to the 90° polarization rotator 7, and thence through the second transducer 11.

As described above, the sensor head 4 is designed to measure voltage in the conductor 52 when the sensor head is placed in an E-field created by the conductor. In the preferred embodiment, the sensor head 4 is placed in an insulator 50 between the conductor 52 and a grounded conductor 48 (see FIG. 1 and FIG. 2 and related discussions in the specification). Although an E-field originator 96 (shown generally in FIG. 1 and FIG. 2) is the preferred embodiment for generating an E-field in this arrangement, other embodiments of the E-field originator are possible to accomplish the same result.

Figure 9:
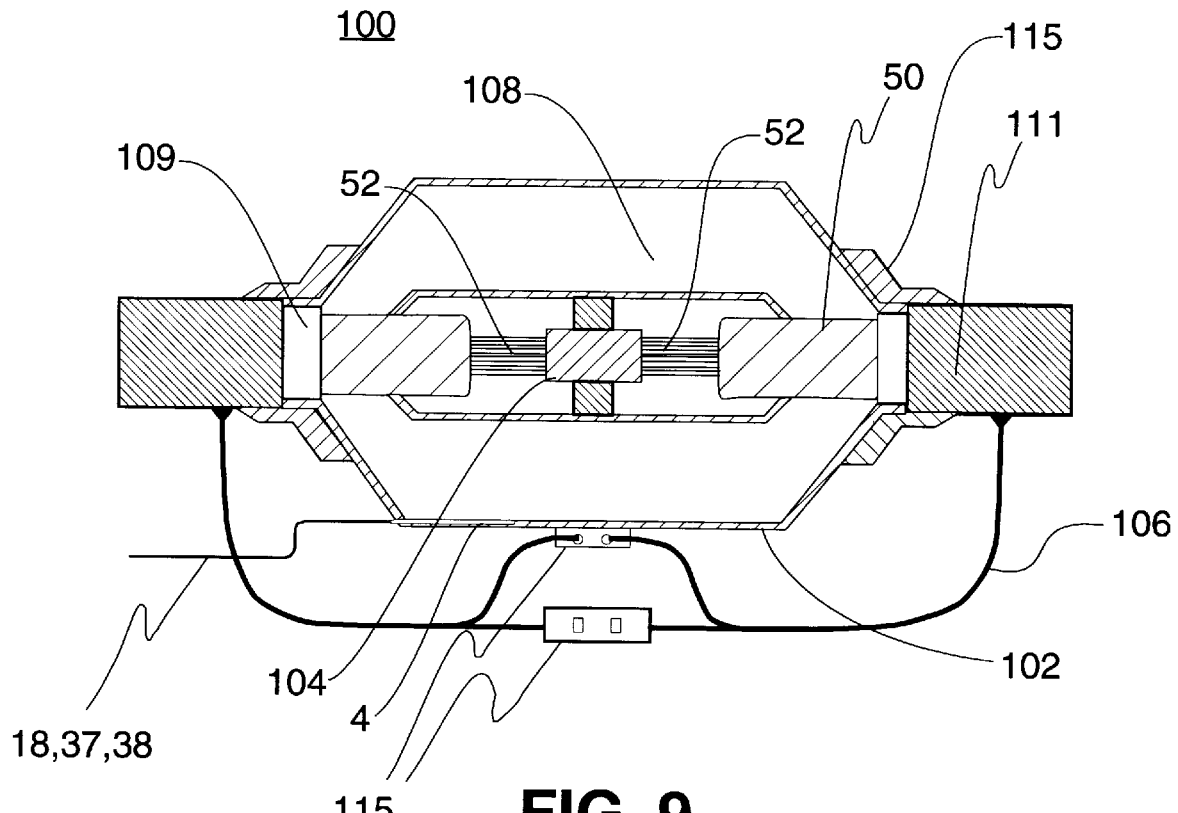
FIG. 9 is a cross-sectional, schematic view of one embodiment of the E-field originator of FIGS. 1 and 2, as a shielded joint.

FIG. 9 illustrates an alternative embodiment of the E-field originator 96 of FIG. 1. In FIG. 9, a shielded joint 100 is the apparatus for generating an E-field in an environment in which the sensor head 4 of the present invention is placed. The shielded joint 100 is referred to as a "joint" because it is located at a position in which two conductors 52 meet. The two conductors 52 each have an insulator 50 sheathed about them which is linearly spaced apart from a conductor connector 104 that surrounds and connects the two conductors. Sheathed about the insulator 50 is a semi-conducting jacket 109 which is, in turn, sheathed with a cable ground shield 111. In addition, about the insulator 50 is placed a layer of shielded joint insulator 108 and a joint ground shield 102. The shielded joint insulator 108 is positioned about the conductor connector 104 and the conductors 52 but it is out of contact therewith. The joint ground shield 102 is held in place and supported with end caps 115. A conductive wire 106 and a ground shield connector 113 cause the joint ground shield 102 to be common electrically with the cable ground shield 111. Sensor head 4 is placed in the shielded joint insulator 108 between the joint ground shield 102 and the conductor connector 104. Optical fibers 18, 37, and 38 route an electromagnetic beam to and from the sensor head 4. The E-field of interest, and into which the sensor head 4 is introduced, arises between the joint grounding shield 102 and conductor connector 104 when an electric voltage is present upon the conductors 52.

Figure 10:
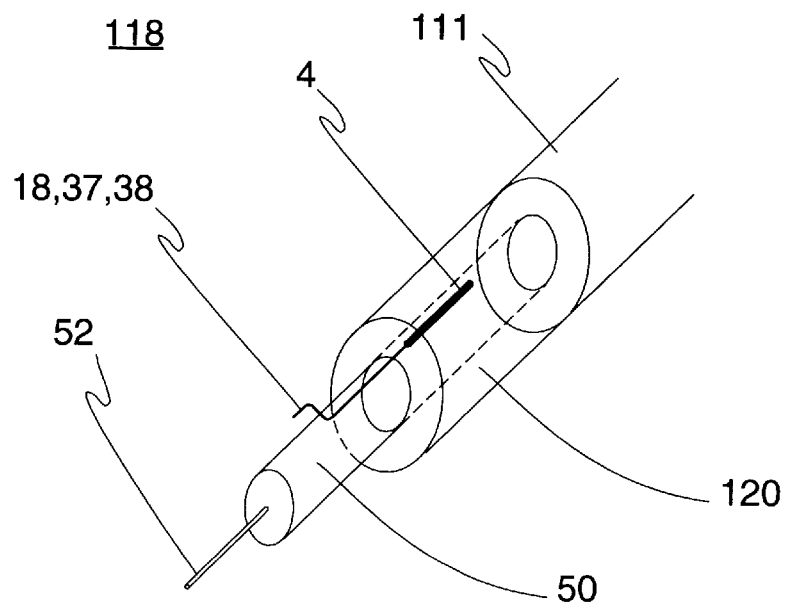
FIG. 10 is a top perspective, partially schematic view of one embodiment of the E-field originator of FIGS. 1 and 2, as a terminator.

Another expression of the E-field originator 96 is the terminator 118 shown in FIG. 10. In the preferred embodiment showing a terminator 118, a conductor 52 is enclosed within insulation 50 forming a transition span. The insulation 50 is enclosed within a voltage gradient control means 120. A cable ground shield 111 may partially enclose the voltage gradient control means 120. The sensor head 4 is disposed between the conductor 52 and the voltage gradient control means 120. Optical fibers 18, 37, 38 route the beam to and from the sensor head 4. The E-field of interest, and into which the sensor head 4 is introduced, arises between conductor 52 and the voltage gradient control means 120 when a voltage is present upon the conductor 52.

Figure 11:
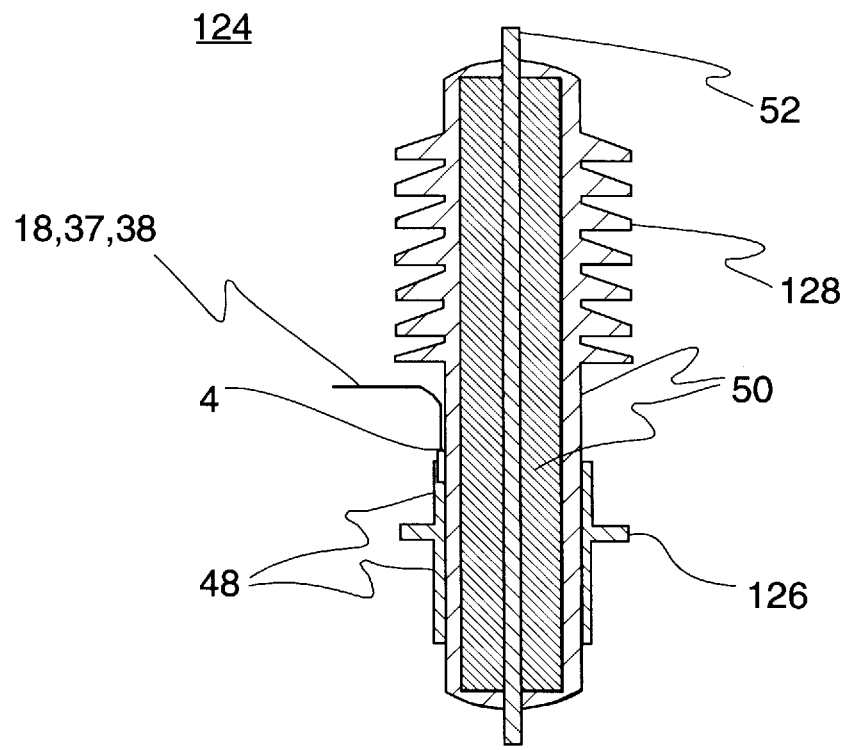
FIG. 11 is a cross-sectional side view of one embodiment of the E-field originator of FIGS. 1 and 2, as a bushing.

Another embodiment of the E-field originator 96 of FIGS. 1 and 2 is the through-hole insulator 124, here shown as a transformer bushing in FIG. 11. In the preferred embodiment showing a through-hole insulator 124, a conductor 52 is enclosed within insulation 50, which is at least partially enclosed within a grounded conductor 48. The through-hole insulator shown here as a transformer bushing has a mounting flange 126 for mounting the bushing and creepage distance skirts 128 which extend from the grounded conductor 48. The sensor head 4 is disposed between the conductor 52 and the grounded conductor 48. Optical fibers 18, 37, 38 route the beam to and from the sensor head 4. The E-field of interest, and into which the sensor head 4 is introduced, arises between the conductor 52 and the grounded conductor 48 when a voltage is present upon the conductor 52.

Figure 12:
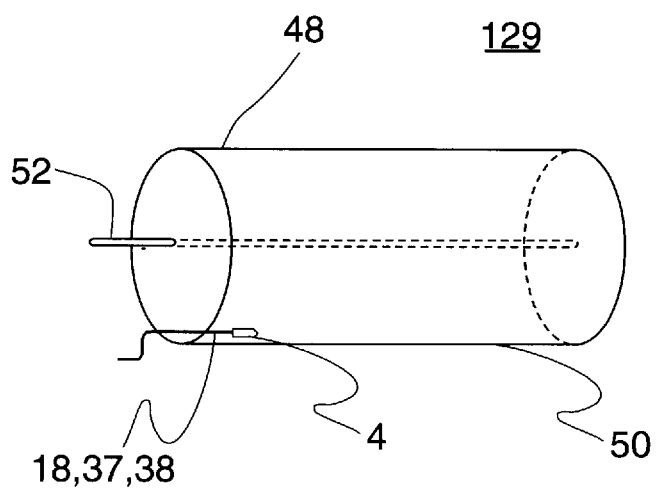
FIG. 12 is a sectional, partially schematic, side view of one embodiment of the E-field originator of FIGS. 1 and 2, as a shielded bus or shielded cable.

Another embodiment of the E-field originator 96 of FIGS. 1 and 2 is the shielded cable or bus 129, shown in FIG. 12. In the preferred embodiment of a shielded cable or bus 129, a conductor 52 is enclosed within insulation 50, which is enclosed within a grounded conductor 48. The sensor head 4 is disposed between the conductor 52 and the grounded conductor 48. Optical fibers 18, 37, 38 route the beam to and from the sensor head 4. The E-field of interest, and into which the sensor head 4 is introduced, arises between the conductor 52 and the grounded conductor 48 when a voltage is present upon the conductor 52. Whereas FIG. 12 shows a bus having a round cross-section, an alternative and equivalent embodiment comprises a rectangular (or square) cross-section.

Figure 13:
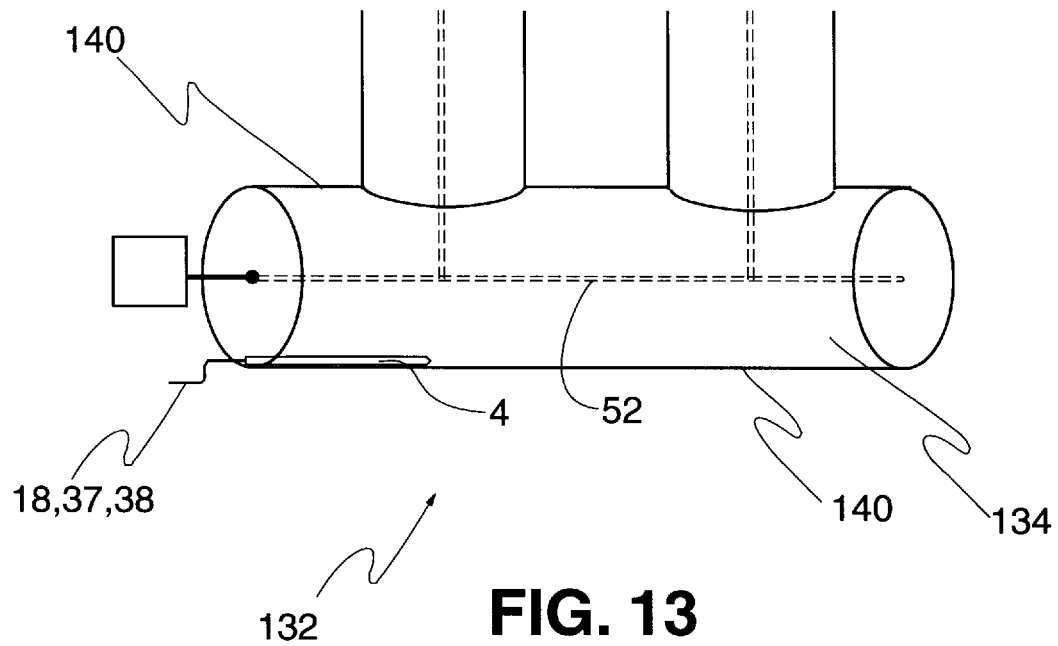
FIG. 13 is a sectional, partially schematic, side view of one embodiment of the E-field originator of FIGS. 1 and 2, as a gas or oil-insulated switchgear.

Another embodiment of the E-field originator 96 shown in FIGS. 1 and 2 is the gas or oil-insulated switchgear 132, shown in FIG. 13. In the preferred embodiment showing a gas or oil-insulated switchgear 132, a conductor 52 is enclosed within gas or oil insulation 134, by a grounded conductive or semi-conductive containment means 140 for containing the gas or oil insulation. The sensor head 4 is disposed between the conductor 52 and the grounded containment means 140. Optical fibers 18, 37, 38 route the beam to and from the sensor head 4. The E-field of interest, and into which the sensor head 4 is introduced, arises between the conductor 52 and the grounded containment means 140 when a voltage is present upon the conductor 52.

Figure 14:
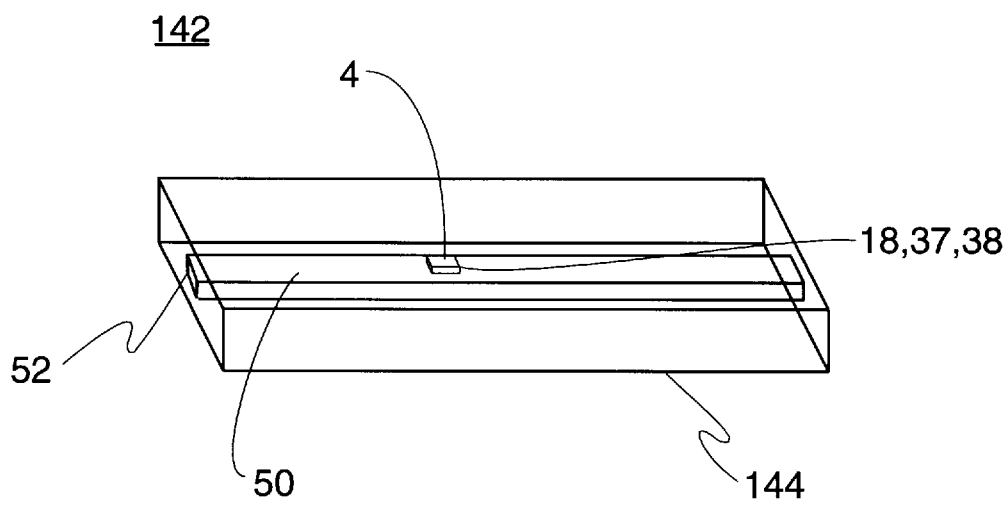
FIG. 14 is a sectional, partially schematic, side view of one embodiment of the E-field originator of FIGS. 1 and 2, as a duct-enclosed bus.

Another embodiment of the E-field originator 96 is the duct-enclosed bus 142, shown in FIG. 14. In the preferred embodiment of a duct-enclosed bus 142, a conductor 52 is enclosed within insulation 50 of sufficient thickness to minimize possibility of flash-over. The insulated bus is enclosed within a grounded duct or other grounded at least semi-conducting means 144. Those skilled in the art will appreciate that by the term "at least semi-conducting", it is meant all semi-conducting and conducting means, by which the bus can be grounded. The sensor head 4 is disposed between the conductor 52 and the grounded semi-conducting means 144. Optical fibers 18, 37, 38 route the beam to and from the sensor head 4. The E-field of interest, and into which the sensor head 4 is introduced, arises between the conductor 52 and the grounded semi-conducting means 144 when a voltage is present upon the conductor 52.

Figure 15:
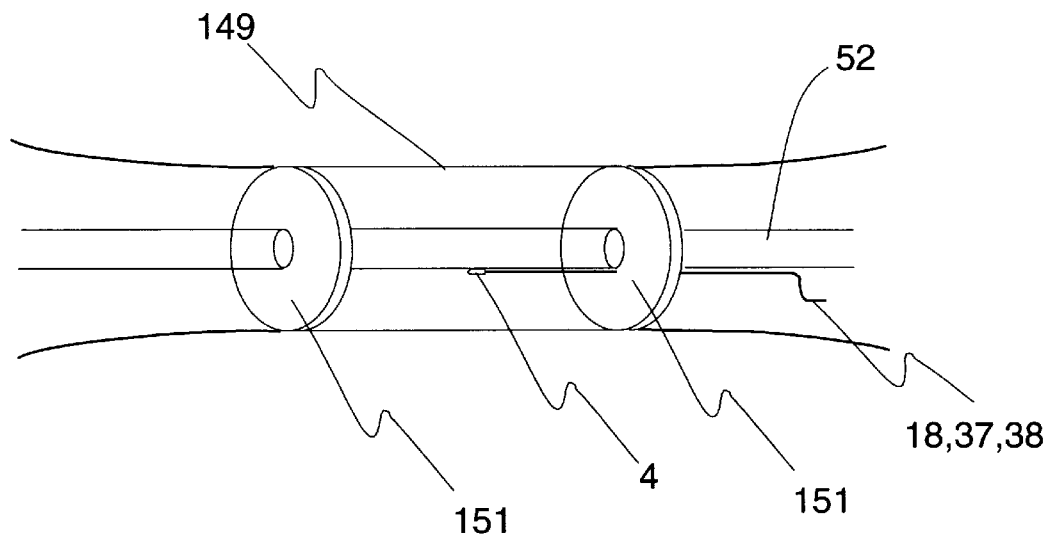
FIG. 15 is a side view of one embodiment of the E-field originator of FIGS. 1 and 2, as a clamp-on apparatus.

Another embodiment of the E-field originator 96 is the clamp-on apparatus 147, shown in FIG. 15. In the preferred embodiment of the clamp-on apparatus, a conductor 52 is enclosed within a coaxial conductive grounded surrounding means 149. In the practice of the invention, the conductor 52 is preferably a nonshielded transmission line, a nonshielded cable, or a nonshielded bus. The conductor 52 is separated from the conductive grounded surrounding means 149 by insulated standoff means 151. The sensor head 4 is disposed between the conductor 52 and the coaxial conductive grounded surrounding means 149. Optical fibers 18, 37, 38 route the beam to and from the sensor head 4. The E-field of interest, and into which the sensor head 4 is introduced, arises between the conductor 52 and the coaxial conductive grounded surrounding means 149 when a voltage is present upon the conductor 52.

Figure 16:
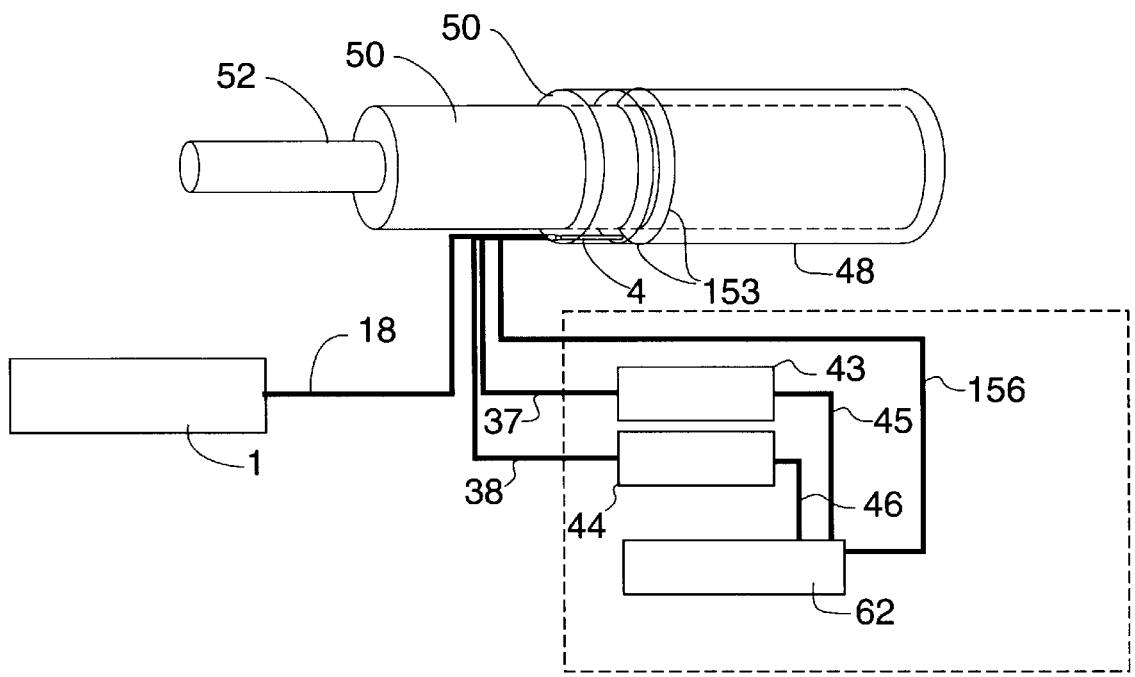
FIG. 16 is an alternative embodiment of the electro-optical voltage sensor of FIG. 1 having a current detector.

FIG. 16 is an alternative embodiment of the electro-optical voltage sensor of FIG. 1, having a current detector 153 disposed substantially in common with the sensor head. The current detector 153 detects the current, not shown, passing through the conductor 52 by detecting the magnetic field, not shown, associated with the current. The current detector provides a current signal, not shown, which is routed through a current signal routing member 156 to the signal processor 62. In one embodiment the optical current signal routing member 156 consists of optic fiber, photodetection means, and electrical connecting means, none of which are shown. Where voltage (V) and current (I) are known, the power (P) can be determined by the signal processor by multiplying the current (I) by the voltage (V) as follows:

$$P=IV$$

A combination of at least two sensors of the present invention may be used to achieve a line-to-ground voltage measurement on separate conductors of a multi-source system. "Multi-source system" is meant a to include both a multi-phase as well as a multi-line system. In such a system, line-to-ground measurements may also be used to calculate line-to-line voltages through simple subtraction of line-to-ground values.

The present invention represents a significant advance over the prior apparatus, methods and art of voltage measurement. The present invention does not require any additional electronics to bias the transducing material to determine voltage, such as a voltage divider. Voltage is determined in the present invention by utilizing the E-field that exists within many types of devices to transmit and distribute power, often these power distribution devices are co-axial, which simplifies the application of the present invention. The E-field, which is proportional to voltage, is used to bias a transducing element in order to induce a differential phase shift in the orthogonal planes of the beam, which as modulated optic signals, is proportional to voltage.

It is noted that many of the advantages of the present invention accrue due to the simplified structure of the sensor head, which is sufficiently small so as to be conveniently installed in devices in which E-fields arise, or built in as part of a sensor.

Although the prior art apparatus and methods for voltage measurement have attempted to use the electro-optical effect in materials having either a Pockels or Kerr coefficient, they have typically required a separate compensator crystal with a known reference voltage or a separate voltage divider directly connected to the energized conductor in order to make a voltage measurements. The result has been devices which were bulky and required additional electronics for measuring the known reference, or required extra hardware presenting size, weight, expense, reliability, and other problems.

By using the sensor head of the present invention, which may be installed or built into the described voltage transmission and distribution apparatus, voltage measurement is achieved without the use of a large, dedicated, stand-alone voltage division device. Real estate within Power substations is at a premium, thus this sensor system offers a substantial economic advantage due to space savings. In addition, contact with the energized conductor is substantially reduced and in most cases altogether eliminated with the practice of the present invention. This is advantageous, as an energized conductor can present significant life and health risks among other hazards where high voltages are involved. Further, the practice of the present invention does not interfere with the apparatus being measured, and avoids various other problems associated with the use of the voltage dividers in the prior art.

Those skilled in the art will appreciate from the preceding disclosure that the objectives stated above are advantageously achieved by the present invention.

It is to be understood that the above-described arrangements are only illustrative of the application of the principles of the invention. Numerous modifications and alternative arrangements may be devised by those skilled in the art without departing from the spirit and scope of the present invention and the appended claims are intended to cover such modifications and arrangements.

We claim:

1. A sensor for sensing voltage in an E-field developed between a conductor means and a grounded conductor means, said voltage sensor comprising:

transmitting means for transmitting at least one beam of polarized electromagnetic radiation, said beam having at least two components propagating along at least two orthogonal planes, respectively, to form at least two orthogonal beam components;

sensing means configured for disposition between the conductor means and the grounded conductor means but out of contact with the conductor means for sensing the presence of the E-field and inducing a differential phase shift on the orthogonal beam components when said sensing means is in said E-field as the beam travels along a path through the sensing means;

reflector means disposed adjacent to the sensing means and positioned for receiving the at least one beam from the sensing means when the beam has passed out of the sensing means and for channeling the been along a path substantially parallel to the path through the sensing means;

detecting means for detecting said differential phase shift of said orthogonal beam components; and first and second routing means, said first routing means for routing said beam from said transmitting means to said sensing means, and said second routing means for routing said beam components from said sensing means to said detecting means.

2. The sensor as in claim 1, wherein said first and second routing means each comprises:

at least one translucent element for routing said beam and said beam components.

3. The sensor as in claim 2, wherein each of said at least one translucent element comprises at least one optic fiber.

4. The sensor as in claim 3, wherein said at least one optic fiber comprises an optic fiber selected from the group consisting of:

(1) a single-mode optic fiber, and
(2) a multi-mode optic fiber.

5. The sensor as in claim 4, wherein at least one of said optic fibers comprises a polarization maintaining (PM) optic fiber for routing said beam with decreased loss of polarization of the beam.

6. The sensor as in claim 4, wherein at least one of said optic fibers comprises a low birefringence optic fiber for routing said beam with decreased loss of polarization of the beam.

7. The sensor as in claim 1, wherein said sensing means further comprises:

beam splitting means for separating orthogonal beam components oriented along the axes of the beam's polarization ellipse (whose ellipticity varies between −1 and +1 in proportion to voltage) and forming at least two independent amplitude-modulated signals therefrom, respectively.

8. The sensor as in claim 1, wherein said detecting means further comprises:

beam separation means for separating orthogonal beam components oriented along the axes of the beam's polarization ellipse (whose ellipticity varies between −1 and +1 in proportion to voltage) and forming at least two independent amplitude-modulated signals therefrom, respectively; and processing means for converting said independent-amplitude modulated signals into at least one display signal proportional to the voltage of said E-field.

9. The sensor as in claim 8, wherein said processing means further comprises:

optic-to-electronic conversion means for converting said AM signals into analog electronic signals, wherein said analog electronic signals comprise signals selected from the group consisting of:

(1) low-level analog voltage signals, and
(2) current signals.

10. The sensor as in claim 9, wherein said processing means further comprises:

analog-to-digital conversion means for converting said analog electronic signals into at least one digital electronic signal.

11. The sensor of claim 1, wherein said sensor further detects the presence and magnitude of a magnetic field caused by a current, wherein said sensor further comprises:

current detection means for detecting said magnetic field and determining the current therefrom, said current detection means being disposed substantially in common with said sensing means.

12. A method of using a sensor head as part of a system for sensing voltage in an E-field developed between a conductor means and a grounded conductor means, said sensor head having an electro-optical sensing means for inducing a differential phase shift of at least two beam components propagating in at least two orthogonal planes as electromagnetic wave components of a beam of electromagnetic radiation from transmitting means when said sensor head is in an E-field, said method comprising the steps of:

(a) disposing the sensor head in the E-field between the conductor means and the grounded conductor means and out of contact with the conductor means;

(b) developing an electromagnetic radiation beam having at least two beam components propagating along at least two orthogonal planes, respectively;

(c) routing said beam from said transmitting means along a path through said sensor head to induce a differential phase shift of the beam components;

(d) routing said beam from said sensor head to processing means including reflecting the beam to travel along a path generally parallel to the path through the sensor after the beam has passed out of the sensor head; and (e) processing said beam components by converting the components into at least one electrical signal whose value is proportional to the voltage of the E-field at the sensor head.

13. The method as defined in claim 12, wherein the routing of step (c) further comprises:

separating specific beam components from said beam into at least two independent amplitude modulated signals, each independent amplitude modulated signal comprising a beam component.

14. The method as defined in claim 12, wherein the processing of step (d) further comprises the steps of:

(e) sampling the electrical signal at substantially regular intervals, said sampling occurring substantially simultaneously for so all beam components;

(f) storing said sampled signal; and (g) manipulating said sampled signal of each beam component so as to convert said signals into a display signal, said display signal being proportional to the voltage of said E-field.

15. The method of claim 14, in which the manipulating of step (g) further comprises the steps of:

(h) determining an average electrical signal for each beam component by summing the sampled electrical signals of each beam component over a specified time interval and dividing said sum by the number of samples of the beam component taken in that interval;

(i) determining an adjusted instantaneous signal for each beam component by comparing the most recent electrical signal of the beam component sampled with the most recently calculated average electrical signal of the beam component and taking the difference thereof;

(j) determining an adjusted average instantaneous signal for all beam components by summing the adjusted instantaneous signal of each beam component and dividing the same by the number of beam components; and (k) determining a scaled adjusted average instantaneous signal by proportionally increasing the scaled adjusted average instantaneous signal by multiplying said adjusted average instantaneous signal by a scaling constant; said scaled adjusted average instantaneous signal is a display signal representing voltage between ground and the energized conductor on which the voltage measurement is being taken.

16. The method of claim 14, further comprising the step of:

(1) displaying said display signal on display means, wherein said display means for displaying said display signal is selected from the group consisting of:

(1) a digital display;
(2) a hardcopy display;
(3) a video display;
(4) a software display;
(5) a computer memory; and
(6) an audible indicator.

17. A sensor for sensing voltage in an E-field developed between a conductor means and a grounded conductor means with insulator means disposed therebetween, said voltage sensor comprising:

transmitting means for transmitting at least one beam of polarized electromagnetic radiation, said beam having at least two components propagating along at least two orthogonal planes, respectively, to form at least two orthogonal beam components;

sensing means configured for disposition in the insulator means between the conductor means and the grounded conductor means, but out of contact with the conductor means, for sensing the presence of the E-field and inducing a differential phase shift on the orthogonal beam components when said sensing means is in said E-field as the beam travels along a path through the sensing means;

detecting means for detecting said differential phase shift of said orthogonal beam components; and first and second routing means, said first routing means for routing said beam from said transmitting means to said sensing means, and said second routing means for routing said beam components from said sensing means to said detecting means.

18. A sensor for sensing voltage in an E-field developed by a conductor and a grounded conductor, comprising:

transmitting means for transmitting at least one beam of polarized electromagnetic radiation, said beam having at least two components propagating along at least two orthogonal planes, respectively, to form at least two orthogonal beam components;

sensing means disposed between the conductor and the grounded conductor but out of contact with the conductor for sensing the presence of the E-field and inducing a differential phase shift on the orthogonal beam components when said sensing means is in said E-field as the beam travels along a path through the sensing means;

beam splitting means for separating orthogonal beam components oriented along the axes of the beam's polarization ellipse and forming at least two independent amplitude modulated signals therefrom, respectively;

first and second routing means, said first routing means for routing said beam from said transmitting means to said sensing means, and said second routing means for routing said beam components from said sensing means to said detecting means; and detecting means for detecting said differential phase shift of said orthogonal beam components based on the at least two independent amplitude modulated signals.

* * * * *